US009696393B2

United States Patent
Arias et al.

(10) Patent No.: US 9,696,393 B2
(45) Date of Patent: Jul. 4, 2017

(54) MRI RECEIVER COIL PROVIDING AN ENHANCED SIGNAL-TO-NOISE RATIO

(71) Applicant: The Regents of the University of California, Oakland, CA (US)

(72) Inventors: Ana Claudia Arias, Lafayette, CA (US); Shimon Michael Lustig, Moraga, CA (US); Anita M. Flynn, Oakland, CA (US); Joseph Corea, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 620 days.

(21) Appl. No.: 14/166,679

(22) Filed: Jan. 28, 2014

(65) Prior Publication Data

US 2014/0210466 A1    Jul. 31, 2014

Related U.S. Application Data

(60) Provisional application No. 61/757,671, filed on Jan. 28, 2013.

(51) Int. Cl.
*G01R 33/34* (2006.01)
*G01R 33/3415* (2006.01)
*G01R 33/36* (2006.01)

(52) U.S. Cl.
CPC . *G01R 33/34084* (2013.01); *G01R 33/34007* (2013.01); *G01R 33/3415* (2013.01); *G01R 33/3628* (2013.01); *Y10T 29/4902* (2015.01)

(58) Field of Classification Search
CPC ........ G01R 33/34084; G01R 33/34007; G01R 33/3415; G01R 33/3628; Y10T 29/4902
See application file for complete search history.

(56) References Cited

U.S. PATENT DOCUMENTS

| | | | | |
|---|---|---|---|---|
| 3,947,934 A | * | 4/1976 | Olson | .................. H01L 27/016 257/E27.116 |
| 5,594,339 A | * | 1/1997 | Henderson | ....... G01R 33/34084 324/318 |
| 5,819,737 A | * | 10/1998 | Young | .................. G01R 33/285 324/309 |
| 6,615,063 B1 | * | 9/2003 | Ntziachristos | ....... A61B 5/0073 600/312 |
| 2007/0239256 A1 | * | 10/2007 | Weber | .................... A61B 5/055 623/1.15 |
| 2008/0252395 A1 | * | 10/2008 | Liu | ..................... H01F 17/0006 333/177 |
| 2010/0160173 A1 | * | 6/2010 | Mchale | .................. G01N 24/08 506/9 |
| 2012/0161768 A1 | * | 6/2012 | Hardy | ................ G01R 33/3642 324/318 |

* cited by examiner

*Primary Examiner* — Rodney Bonnette
(74) *Attorney, Agent, or Firm* — Gavrilovich, Dodd & Lindsey LLP

(57) ABSTRACT

A Magnetic Resonance Imaging (MRI) receiver includes a receiver coil on a substrate. The receiver coil includes one or more capacitors. The construction of the capacitors allows for the use of very flexible substrates and allows the capacitors themselves to be highly flexible. The increased flexibility permits the MRI receiver to be conformed to the body of a patient and accordingly improves the MRI process.

28 Claims, 5 Drawing Sheets

12 = substrate
30 = dielectric layer
36 = conductive layer
22 = tuning capacitor
32 = interconnect portion
38 = second plate portion
28 = conductor layer
34 = first plate portion
40 = connection portion 10 = receiver coil
12 = substrate
14 = electrical conductors
16 = electrical contacts
18 = capacitors
20 = match capacitor
22 = tuning capacitor
24 = parallel conductors
26 = series conductors

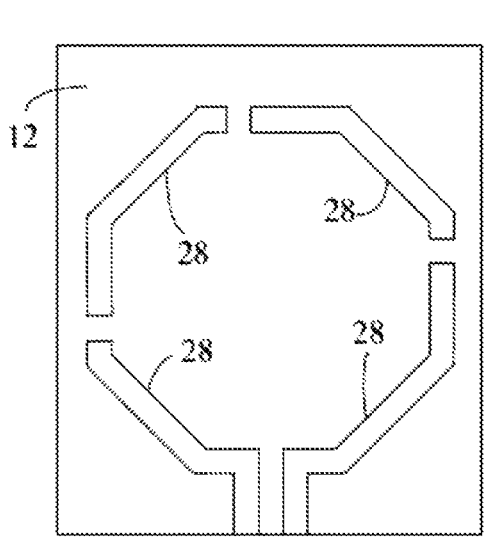
Figure 2A
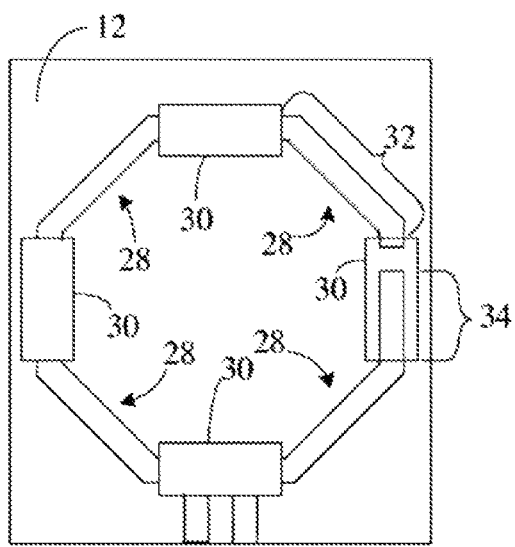
Figure 2B
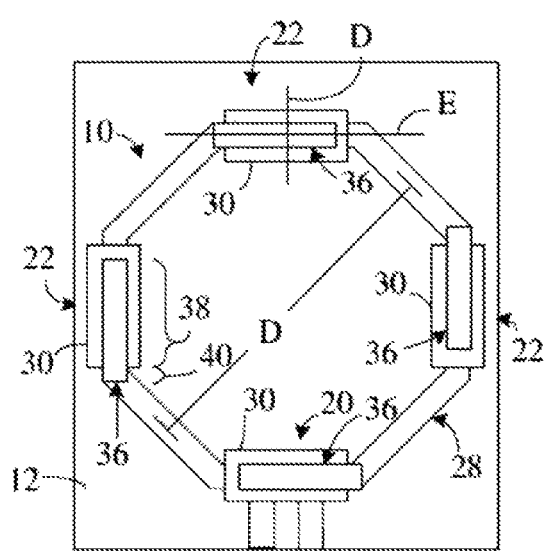
Figure 2C
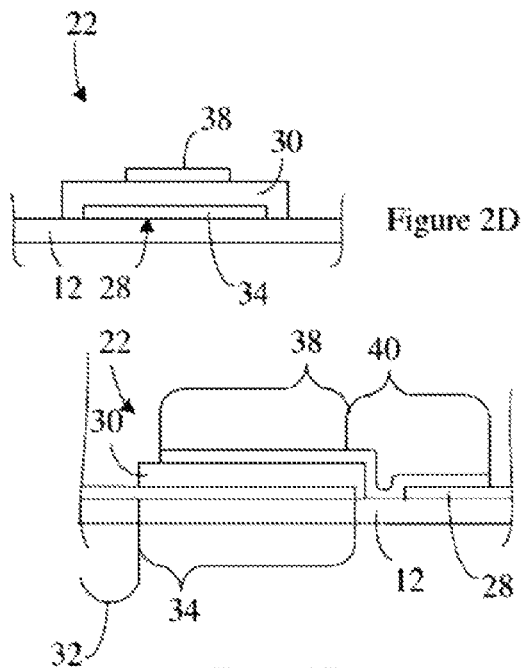
Figure 2D
Figure 2E
10 = receiver coil
16 = electrical contacts
22 = tuning capacitor
28 = conductor layer
34 = first plate portion
40 = connection portion
12 = substrate
18 = capacitors
24 = parallel conductors
30 = dielectric layer
36 = conductive layer
14 = electrical conductors
20 = match capacitor
26 = series conductors
32 = interconnect portion
38 = second plate portion

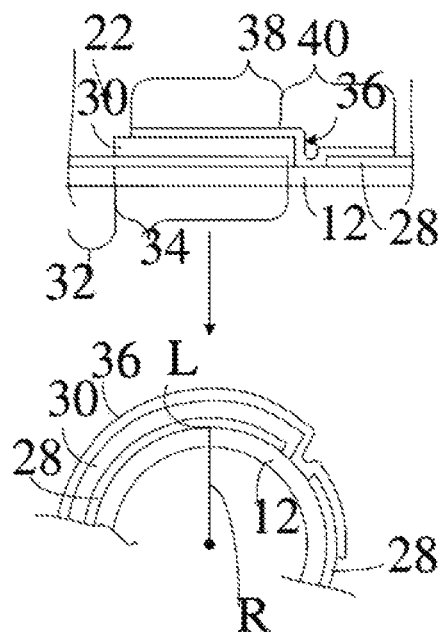
12 = substrate  22 = tuning capacitor  28 = conductor layer
30 = dielectric layer  32 = interconnect portion  34 = first plate portion
36 = conductive layer  38 = second plate portion  40 = connection portion
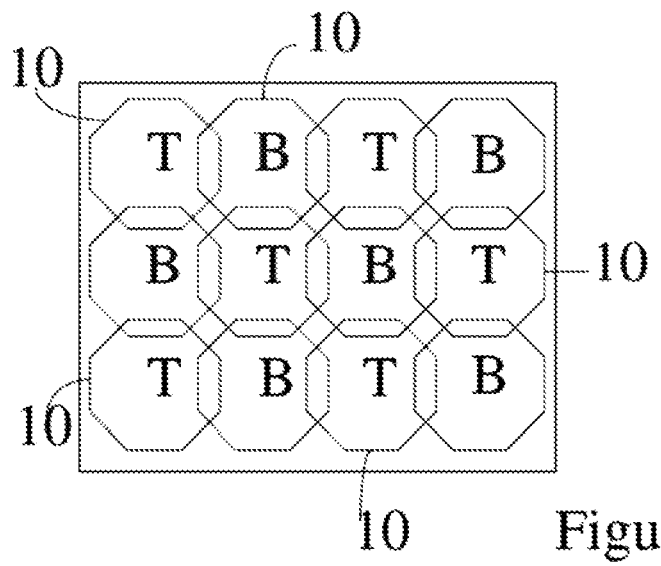
10 = receiver coil

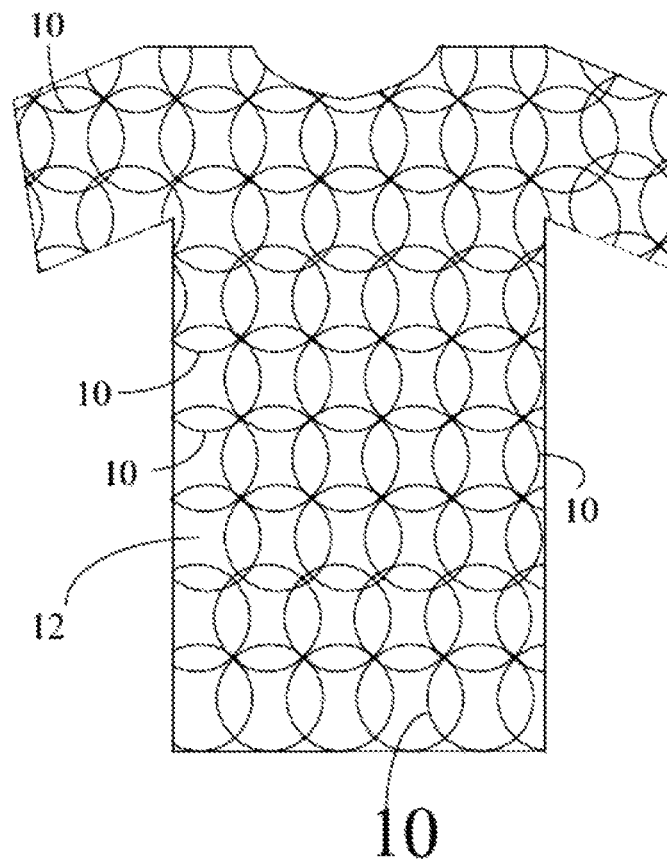
10 = receiver coil
12 = substrate
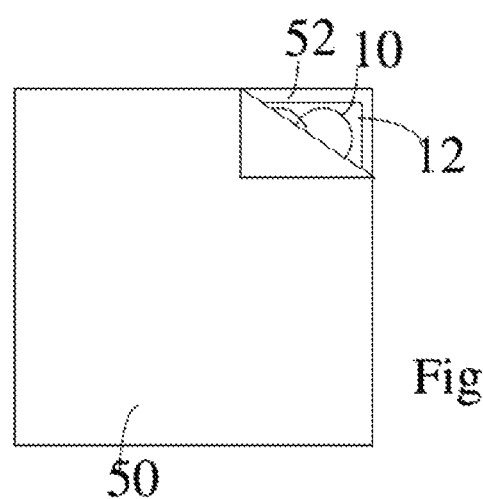
Figure 6
10 = receiver coil    12 = substrate    50 = top layer    52 = bottom layer

MRI RECEIVER COIL PROVIDING AN ENHANCED SIGNAL-TO-NOISE RATIO

CROSS REFERENCE TO RELATED APPLICATIONS

This application claims the benefit of U.S. Provisional patent application Ser. No. 61/757,671, filed on Jan. 28, 2013, entitled "Flexible Screen Printed MRI Receiver Coil Arrays," and is incorporated herein in its entirety.

FIELD

The invention relates to Magnetic Resonance Imaging (MRI) and more particularly to receiver coils for use in MRI.

BACKGROUND

Magnetic Resonance Imaging (MRI) has become a common imaging tool used in a variety of different medical applications such as diagnosis. During MRI, a patient is positioned within an MRI scanner and a magnetic field is formed around the area to be imaged. The magnetic field is applied at a frequency that excites hydrogen atoms that are present in tissue containing water molecules. The excited hydrogen atoms produce RF signals that are picked up by receiver coils that are usually positioned on the patient. These receiver coils are currently undesirably expensive and produce undesirably low signal-to-noise ratios. A low signal-to-noise ratio can increase scan times and/or decrease image quality.

For the above reasons, there is a need for an affordable MRI receiver coil that can provide an increased signal-to-noise ratio.

SUMMARY

A Magnetic Resonance Imaging (MRI) receiver includes a receiver coil on a substrate. The receiver coil includes a capacitor. The MRI receiver is sufficiently flexible that the MRI receiver can be bent such that a point located on the substrate and under the capacitor has a radius of curvature less than 500 mm, 120 mm or even 15 mm without degrading the performance of the MRI receiver. In some instances, the MRI receiver can be creased at the point without degrading the performance of the MRI receiver.

Another example of a Magnetic Resonance Imaging (MRI) receiver includes a receiver coil on a substrate. The receiver coil includes a capacitor. The lower plate of the capacitor is between an upper plate of the capacitor and the substrate. The lower plate of the capacitor is a coating on the substrate.

A collection of Magnetic Resonance Imaging (MRI) receivers can be constructed such that each MRI receiver has a receiver coil on a substrate. Each of the receiver coils includes a capacitor. Each of the different capacitors has a dielectric layer with a different percentage of a dielectric material in the dielectric layer. Additionally, the different receiver coils each has a different resonant frequency when exposed to the same magnetic field. However, the receiver coils are constructed such that the different receiver coils would have the same resonant frequency if the dielectric layer in each of the different capacitors had the same percentage of the dielectric material.

A method of forming a Magnetic Resonance Imaging (MRI) receiver includes forming a receiver coil on a substrate. The receiver coil includes a capacitor that includes a dielectric layer between a first plate and a second plate. Forming the receiver coil includes screen-printing a layer of material on the substrate such that the layer of material serves as the first plate, the dielectric layer, or the second plate.

In some instances, the method includes screen printing a second layer of material on the substrate such that the second layer of material serves as the first plate, the dielectric layer, or the second plate. The second layer and the first layer serve as different components. In some instances, the method also includes screening printing a third layer of material on the substrate such that the third layer of materials serves as the first plate, the dielectric layer, or the second plate. The first layer, the second layer, and the third layer also serve as different components.

Another embodiment of a method includes generating multiple Magnetic Resonance Imaging (MRI) receivers such that each MRI receiver has a receiver coil on a different substrate and each of the receiver coils includes a capacitor. Generating the MRI receivers includes generating the different capacitors such that each of the different capacitors has a dielectric layer with a different percentage of a dielectric material in the dielectric layer. Each of the different receiver coils has a different resonant frequency when exposed to the same magnetic field; however, the different receiver coils would have the same resonant frequency if the dielectric layer in each of the different capacitors had the same percentage of the dielectric material. In some instances, one of the receiver coils is identified by comparing the different resonant frequencies with a target frequency. The percentage of the dielectric material in the dielectric layer for the identified receiver coil can then be used in subsequently generated receiver coils.

In some instances, the substrate includes or consists of a porous material such as a cloth, fabric, or woven material. Accordingly, the MRI receiver can be a blanket or article of clothing, a blanket, or towel.

BRIEF DESCRIPTION OF THE FIGURES

FIG. 2A-E illustrate a method of forming an MRI receiver having a schematic as shown in FIG. 1. The MRI receiver is constructed from a series of device precursors. (A) is a topview of a device precursor having a first conductor layers on a substrate. (B) is a topview of the device precursor of FIG. 2A with dielectric layers arranged such that a portion of each dielectric layer is over a portion of each first conductor layer. (C) is a topview of the device precursor of FIG. 2B with second conductive layers arranged such that a portion of each of the second conductive layers is over a dielectric layer. (D) is a cross section of the MRI receiver shown in FIG. 2C taken along the line labeled D in FIG. 2C. (E) is a cross section of the MRI receiver shown in FIG. 2C taken along the line labeled E in FIG. 2C.

FIG. 3 illustrates bending of an MRI receiver through one of the capacitors.

FIG. 4 illustrates an MRI receiver having multiple receiver coils on a single substrate.

FIG. 5 is a sideview of an article of clothing that operates as an MRI receiver.

FIG. 6 illustrates construction of a blanket that operates as an MRI receiver.

DESCRIPTION

Figure 1:
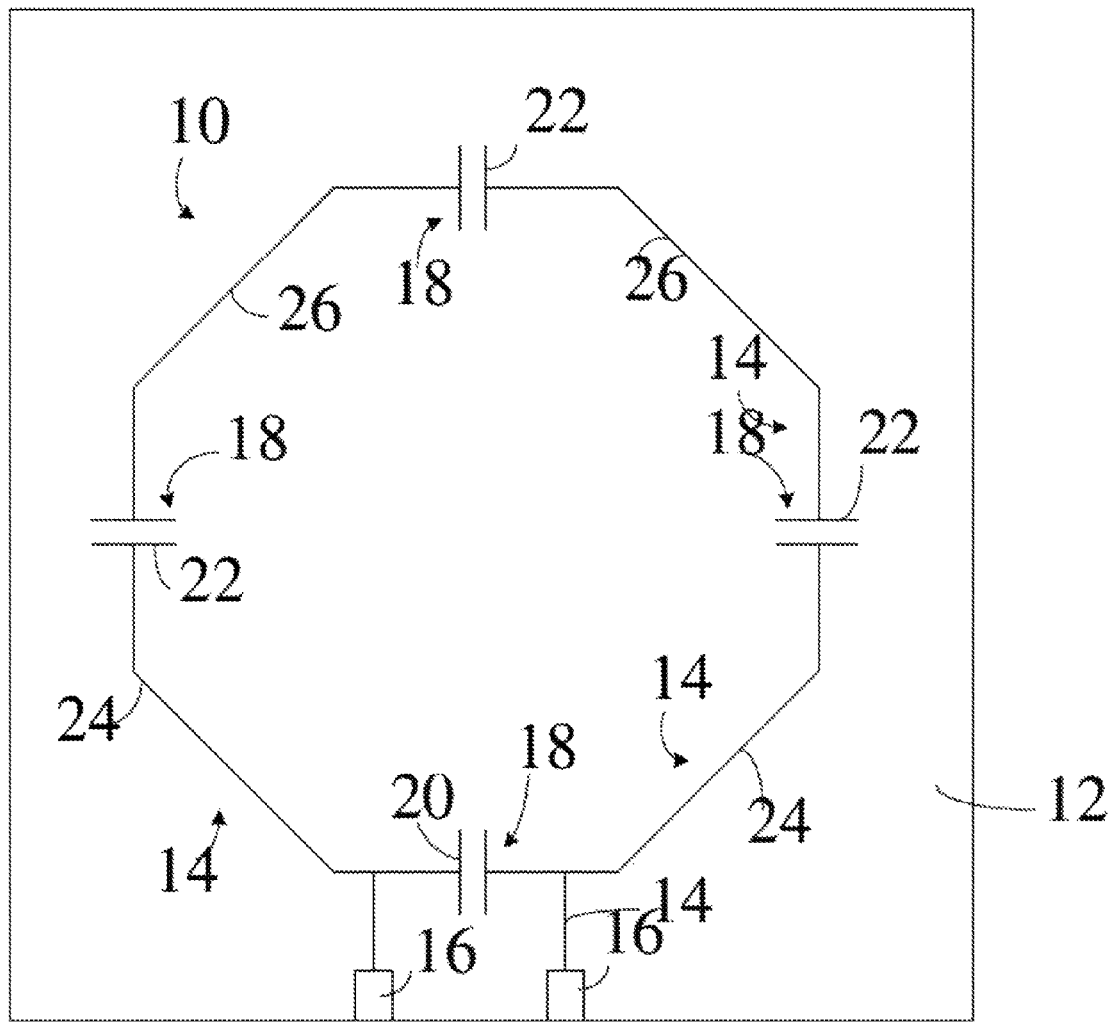
FIG. 1 is a schematic of an example MRI receiver.

As used herein and in the appended claims, the singular forms "a," "an," and "the" include plural referents unless the context clearly dictates otherwise. Thus, for example, reference to "a substrate" includes a plurality of such substrates and so forth.

Unless defined otherwise, all technical and scientific terms used herein have the same meaning as commonly understood to one of ordinary skill in the art to which this disclosure belongs. Although any methods and reagents similar or equivalent to those described herein can be used in the practice of the disclosed methods and compositions, the exemplary methods and materials are now described.

All publications mentioned herein are incorporated herein by reference in full for the purpose of describing and disclosing the methodologies, which are described in the publications, which might be used in connection with the description herein. The publications discussed above and throughout the text are provided solely for their disclosure prior to the filing date of the present application. Nothing herein is to be construed as an admission that the inventors are not entitled to antedate such disclosure by virtue of prior disclosure. Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

An MRI receiver includes an MRI receiver coil on a substrate. The receiver coil includes conductors and a capacitor on a substrate. The conductors, capacitor, and substrate are constructed from layers of material coated on the substrate and on one another. This construction allows the entire MRI receiver to be highly flexible. For instance, the MRI receiver can be sufficiently flexible that the MRI receiver can be conformed to the body part that is being imaged without damaging the performance of the MRI receiver. The ability of the MRI receiver to conform to body parts is retained even for very angular bodyparts such as ankles, feet, fingers, or elbows.

Prior MRI receivers have used rigid substrates and/or bonded discrete electrical components to the substrate at discrete connection points. Attempting to conform the prior MRI receivers to a bodypart bends the portion of the substrate that is under the discrete electrical components and can accordingly damage these connection points. As a result, prior MRI receivers are not suitable for conforming to bodyparts.

The ability to conform the MRI receiver to bodyparts brings the receiver coil closer to the body parts than can be achieved with prior MRI receivers. Moving the receiver coil closer to the bodypart being imaged increases the signal-to-noise ratio provided by the receiver coil. The improved signal-to-noise ratio can reduce scan times and improve image quality. Additionally, the materials and fabrication process for the MRI receiver are sufficiently affordable and scalable for the MRI receiver to be disposable. As a result, the MRI receiver can be affordable and/or improve the MRI process.

FIG. 1 is a schematic of an example of an MRI receiver. The MRI receiver includes a receiver coil 10 on a substrate 12. The receiver coil 10 includes electrical conductors 14, electrical contacts 16, and capacitors 18. In particular, the receiver coil includes a match capacitor 20 connected in parallel with three series connected tuning capacitors 22. Accordingly, the electrical conductors 14 include parallel conductors 24 that make the parallel connections and series conductors 26 that make the series connections. The parallel conductors 24 are each in electrical communication with an electrical contact 16. During operation of the receiver coil 10, electronics can apply electrical energy to the receiver coil 10 through the electrical contacts 16. The series electrical conductors 14 are constructed to act as inductors during the operation of the receiver coil 10. The tuning capacitors 22 prevent the receiver coil 10 from radiating energy and acting as an antenna. Additionally, the tuning capacitors 22 can be used to tune the receiver coil 10 to the desired resonant frequency. The match capacitor 20 is selected to match the input impedance of the receiver coil 10 at the electrical contacts 16 to the output impedance of the electronics applying the electrical energy to the electrical contacts 16. Suitable electronics can include a Q-spoiling circuit. Although FIG. 1 illustrates the receiver coil 10 having three tuning capacitors 22, the receiver coil 10 can include one, two, or more than three tuning capacitors 22. Accordingly, the receiver coil 10 can include one or more tuning capacitors 22.

FIG. 2A through FIG. 2E illustrate a method of forming an MRI receiver having a schematic as shown in FIG. 1. The MRI receiver is constructed from a series of device precursors. FIG. 2A is a topview of a device precursor having first conductor layers 28 on a substrate 12. The first conductor layers 28 are electrically conductive and can each include the same material.

FIG. 2B is a topview of the device precursor of FIG. 2A with dielectric layers 30 arranged such that a portion of each dielectric layer 30 is over a portion of each first conductor layer 28. One of the places where a tuning transistor is being formed includes dashed that illustrate the location of the first conductor layers 28 under the dielectric layer 30. The first conductor layers 28 include an interconnect portion 32 that is not covered by the dielectric layer 30. The first conductor layers 28 also include a first plate portion 34 between the dielectric layer 30 and the substrate 12. Although the dielectric layer 30 is illustrated as a single layer of material, the dielectric layer 30 can include or consist of multiple different layer of material.

FIG. 2C is a topview of the device precursor of FIG. 2B with second conductive layers 36 arranged such that a portion of each second conductive layer 36 is over a dielectric layer 30. The second conductive layers 36 include a second plate portion 38 and a connection portion 40. The first plate portions 34 are arranged such that the dielectric layer 30 is between the first plate portion 34 and the substrate 12. The device precursors in FIG. 2C can serve as an MRI receiver having a receiver coil constructed according to FIG. 1.

FIG. 2D and FIG. 2E are cross sectional views of one of the tuning capacitors 22 on the MRI receiver shown in FIG. 2C. FIG. 2D is a cross section of the MRI receiver shown in FIG. 2C taken along the line labeled D in FIG. 2C. FIG. 2E is a cross section of the MRI receiver shown in FIG. 2C taken along the line labeled E in FIG. 2C. As is evident in FIG. 2E, the thickness of the first conductor layer 28 can optionally be the same in both the first plate portion 34 and in the interconnect portion 32.

A dielectric layer 30 is positioned between the first plate portion 34 of a first conductor layer 28 and the second plate portion 38 of a second conductor layer. The dielectric layer 30 contacts both the first plate portion 34 of the first conductor layer 28 and the second plate portion 38 of the second conductor layer. Accordingly, the first plate portion 34 acts a first plate for the capacitor 18 and the second plate portion 38 acts as the second plate of the capacitor 18. Further, the interconnect portions 32 of the first conductor layers 28 act as the electrical conductors 14 of FIG. 1. For instance the portion of the first conductor layer 28 evident in FIG. 2E can serve as one of the series conductors 26 of FIG. 1.

The connection portion 40 of the second conductor layer provides electrical communication between the second plate portion 38 and another one of the first conductor layers 28. Accordingly, the second conductor layer provides the electrical connection between the tuning capacitor 22 and the remainder of the receiver coil.

The different layers shown in FIG. 2C through FIG. 2E can effectively be coatings on one or more of the underlying layer. As a result, each layer has a side that contacts a side of the underlying layer. Additionally, the side can contact the side of the underlying layer for the full length of either the side itself or for the full length of the underlying side. As an example, the first conductor layer 28 can be coated onto the substrate 12. Accordingly, the first plate portion 34 of the first conductor layer 28 can have a lower side that is in direct physical contact with the top side of the substrate 12 for the entire length of the first plate portion 34. As another example, the first plate portion 34 of the first conductor layer 28 can have an upper side that is in direct physical contact with the bottom side for the entire length of the first plate portion 34. As another example, the second plate portion 38 of the second conductor layer can have a lower side that is in direct physical contact with the top side of the dielectric layer 30 for the entire length of the second plate portion 38.

The different layers of the MRI receiver shown in FIG. 2A through FIG. 2E can be constructed to be sufficiently flexible that the MRI receiver can be conformed to the bodyparts of a patient. For instance, FIG. 3 illustrates bending of an MRI receiver through one of the capacitors 18. In particular, FIG. 3 includes cross sections of an MRI receiver constructed according to FIG. 2C through FIG. 2E before and after being bent at one of the tuning capacitors 22. The radius of curvature at one location (labeled L) on the substrate 12 is labeled R in FIG. 3. The radius of curvature is shown as being measured relative to the top of the substrate 12 where the substrate 12 is interfaced with the first conductor layer 28; however, the radius of curvature can be measured relative to the bottom of the substrate 12. The different layers can be selected such that the capacitors can be bent without damaging, altering, or substantially altering the performance of the receiver coil or the MRI receiver. For instance, the MRI receiver can bent so as to have a radius of curvature of less than 240 mm, 120 mm, 50 mm, 10 mm or 5 mm and/or greater than or equal to 0 mm, 0.1 mm without damaging the MRI receiver. In these radii of curvature, a radius of curvature of 0 corresponds to a crease in the MRI receiver. In some instances, the materials can be selected and/or dimensions such the MRI receiver can be creased without damaging the MRI receiver. For instance, these radii of curvature and/or creasing can be achieved without the occurrence of one or more events selected from the group consisting of the capacitor separating from the substrate, different layers of the capacitor separating from one another, cracking of one or more layers of the capacitor, cracking of the substrate, breakage of one or more layers of the capacitor, and breakage of the substrate. These radii of curvature and/or creasing can be achieved for one or more points on the portion of the substrate 12 located under a capacitor for all or a portion of the capacitors included in the receiver coil, or for any point on the portion of the substrate 12 located under a capacitor for all or a portion of the capacitors included in the receiver coil 10, or concurrently for all points located under a capacitor for all or a portion of the capacitors included in the receiver coil 10. FIG. 3 shows the radius of curvature for one location (labeled L) on the portion of the substrate 12 located under the capacitor. The portion of the substrate 12 located under the capacitor is the portion of the substrate 12 for which a line perpendicular to a surface of the substrate 12 can extend through both the capacitor and the substrate 12.

FIG. 3 shows the MRI receiver bent as a cylinder. As a result, the resulting curve is only in two dimensions. However, the disclosed MRI receiver is sufficiently flexible that it can be bent so it has a curve in three dimensions such as occurs when bent around a knee or shoulder. In case where the curve is three dimensional, the point at which a radius of curvature is measured can be associated with more than one radius of curvature. In these instances, the above radii of curvature can be achieved for the smallest radii of curvature at the point.

The substrate 12 and first conductor layer 28 can be more flexible than the capacitor. As a result, the regions of the MRI receiver outside of the capacitors can be more flexible than even the capacitors. Accordingly, the above radii of curvature and/or creasing can also be achieved for locations on the substrate outside of the transistors without damaging the MRI receiver. As an example, the above radii of curvature and/or creasing can be achieved at a point located on the substrate and under one of the interconnect portions 32 of the first conductor layer without degrading a performance of the MRI receiver, or at any point located on the substrate and under any of the interconnect portion 32 of the first conductor layers without degrading a performance of the MRI receiver.

In some instances, one, two, or three of the layers selected from the group consisting of the first conductor layers 28, the dielectric layer 30, and the second conductor layers are screen printed onto the device precursor. Screen-printing is already used in the production of T-shirts. As a result, this is method that is affordable and easily scaled to production level. In screen-printing, a printing liquid is applied to the device precursor through a screen (or mesh) having open areas and closed areas. The open areas are arranged on the screen in the pattern that is to be transferred onto the device precursor. The printing liquid can pass through the open areas of screen but not the closed areas of the screen. Accordingly, the screen is a stencil. During the printing process, the screen is positioned on or over the device precursor and the printing liquid is positioned on the screen. A fill blade or squeegee is moved across the screen stencil so as to drive the printing liquid through the openings and onto the device precursor. Since the openings are arranged in the desired pattern, the printing liquid is transferred onto the device precursor in the desired pattern. Once transferred to the device precursor, the printing liquid can be dried, cured, or otherwise hardened or otherwise converted to a solid form.

Since screen-printing does not place substantial levels of mechanical or thermal stress on the substrate 12, the range of possible substrates 12 greatly exceeds what was possible with prior MRI receiver fabrication techniques. For instances, the substrate 12 can be thinner than is possible with prior receiver coil fabrication techniques. Reduced substrate 12 thickness can improve the flexibility of the MRI receiver. A suitable thickness for the substrate 12, or for one or more layers of substrate, includes, but is not limited to, a thickness greater than 5 µm, 10 µm, 25 µm, or 50 µm and/or less than 150 µm, 200 µm, or 500 µm. Additionally, or alternately, the substrate 12 can be porous or very soft materials. In some instances, the substrate 12 is sufficiently porous that room temperature water positioned on top of the substrate 12 at room temperature flows through the substrate 12 under the action of gravity. As a result, suitable substrates 12 include, but are not limited to, fibrous materials, fabrics and woven materials including cloths, mats, paper, meshes, perforated sheets, and mechanically roughened surfaces. When the substrate 12 is a fabric that includes or consists of fibers, thread, or yarn, the fibers, thread, or yarn can be synthetic or natural. A porous substrate 12 such as a cloth increases the area of the interface between the substrate 12 and the first conductor layer 28. Accordingly, the use of porous materials can increase the adhesion between the substrate 12 and the first conductor layer 28. Suitable substrates 12 also include or consist of polymers such as plastics that can be porous or non-porous. Examples of suitable substrates 12 that include polymers include, but are not limited to, plastics, polyesters, polyimides, polytetrafluoroethylenes, polyethylene naphthalate and polyethylene terephthalate. The substrate 12 can also be constructed of traditional MRI receiver substrate 12 materials such as FR-4 PCB, and pyralux/polytetrafluoroethylenes. The substrate 12 need not be a single layer of materials but can include one or more layers that are attached to one another. The materials disclosed above as being suitable for a substrate can serve as one of the layers. Accordingly, a substrate can be a layer that is later included in another substrate. For instance, a multi-layer substrate 12 can include a fibrous material such as a cloth or fiber mat that is laminated, bonded, adhered to, or otherwise immobilized on a plastic or polymeric sheet or that is coated with a layer of plastic. In some instances, the plastic reduces the amount of stretching in the fibrous material and accordingly reduce physical changes to the dimensions of the receiver coil during use. The layers of the substrate can be attached before the formation of one or more receiver coils on the substrate. Alternately, the one or more receiver coils can be formed on a first layer of the substrate before the first layer of the substrate is attached to one or more other layers so as to form the substrate. For instance, one or more receiver coils can be formed on a substrate before that substrate is attached to one or more other layers so as to form another substrate.

Another advantage provided by screen-printing is that screen-printing can form the layers with a thickness in a range of 1 to 100 microns with a single layer with larger thickness made possible through the formation of multiple layers by repeating the screen printing process using the same liquid. These thickness levels exceed what can be achieved with other printing techniques such as ink jet printing. Increasing the thickness of the first conductor layer 28, the second conductor layer and/or the dielectric layer 30 can increase the ability of these layers to be flexed without cracking or breaking. Additionally or alternatively, the ability to generate a thicker layer of material for the first conductor layer 28 and the second conductor layer means that the materials for these layers can have a lower conductivity while still providing the an acceptable level of current flow needed for the receiver coil. In some instances, one or more layers selected from the group consisting of the first conductor layer 28, the second conductor layer, and the dielectric layer 30 has a thickness greater than 1 µm, 10 µm, 20 µm, or 30 µm and/or less than 70 µm, 80 µm, or 90 µm. Accordingly, the capacitor can have a thickness less than 90 µm, 150 µm, or 270 µm. As a result, the top of the capacitor can be less than 100 µm, 200 µm, or 300 µm from the top of the substrate 12.

Additionally, screen-printing is suitable for printing of large features on a substrate 12. As a result, screen-printing is suitable for printing clinically useful receiver coils with diameters (labeled D in FIG. 2A) that exceed 16 cm. In contrast, other printing techniques, such as ink jet printing, are generally not practical for production level printing of receiver coils at diameters that are clinically useful.

Screen-printing also permits the inclusion of other electrical components into the receiver coil. For instance, resistors can also be formed by screen printing by printing a layer of an electrically resistive material on the substrate 12 with the electrically resistive material bridging two electrical conductors such that electrical current flows through the electrically resistive material during operation of the receiver coil. Accordingly the substrate 12 and/or the receiver coil can optionally include electrical components other than electrical conductors and capacitors.

Suitable printing liquid for the first conductor layer 28 and/or the second conductor layer include, but are not limited to, conductive inks such as silver inks. Conductive inks can be converted to a solid by a number of methods include, but not limited to, annealing. A printing liquid for the dielectric layer 30 can include or consists of one or more dielectric materials, a solvent and a curable liquid that includes or consists of one or more precursors for an electrically insulating polymer. Another example of a printing liquid for the dielectric layer 30 can include or consists of one or more dielectric materials, a solvent, precursors for a resin, and a curable liquid that includes or consists of one or more precursors for an electrically insulating polymer. Curing the polymer provides a solid dielectric layer 30 that includes the dielectric and the polymer. In some instances, curing the polymer provides a solid dielectric layer 30 that includes the dielectric, polymer, and a resin.

Examples of suitable polymers are ultraviolet light (UV) curable dielectric coatings such as 116-20 available from Creative Materials, Inc. located in Ayer, Mass. An example of a suitable dielectric material is barium titanate ($BaTiO_3$). An example printing liquid for the dielectric layer 30 includes or consists of barium titanate and the precursors for the 116-20 dielectric coating. The resulting printing liquid can be UV cured to form a dielectric layer 30 that includes the barium titanate and the dielectric coating.

A variety of variables affect the resonant frequency of a receiver coil constructed according to FIG. 2C through FIG. 2E. For instance, the resonant frequency for a particular magnetic field can be altered by making changes to one or more variable selected from the coil diameter, dimensions of the first plate, dimensions of the dielectric layer 30, and dimensions of the second plate. The dimensions of the one or more second plate and/or the percentage of the dielectric layer covered by the one or more second plates can be altered to fine tune the frequency of the receiver coil. For a receiver coil of fixed dimensions, the frequency can be tuned by changing the capacitance of the tuning capacitors 22. The capacitance is a function of the percentage of the dielectric material included the dielectric layer 30. Accordingly, the percentage of the dielectric in the dielectric layer 30 can be altered in order to change the receiver coil frequency. As a result, multiple receiver coils can be constructed with the same diameter and tuning capacitor 22 dimensions but different frequencies due to having different dielectric layer 30 compositions. As another example, a set of screens for screen-printing can determine the dimensions of a receiver coil. However, the frequency of the coils that are generated from those screens can still be tuned merely by altering the composition of the dielectric layer 30. As a result, a collection of MRI receivers can be generated such that each MRI receiver includes a receiver coil on a different substrate 12. In some instances, the same set of screen-printing screens is used to generate the receiver coil on each of the different substrates 12. The tuning capacitors 22 on the different receiver coils can each have a dielectric layer 30 with a different composition. For instance, the tuning capacitors 22 on different MRI receivers can have the same dielectric composition but the tuning capacitors 22 on different MRI receivers can different compositions. As a result, the receiver coils on different MRI receivers will have different resonant frequencies even though they are exposed to the same magnetic field (i.e., 1.5 T or 3 T). The different resonant frequencies can be compared with a target frequency and one or more criteria used to identify one of the dielectric compositions as a target composition. Examples of target frequencies include, but are not limited to, 64 MHz for a 1.5 T magnetic field and 128 MHz for a 3 T magnetic field. An example of suitable criteria is the resonant frequency that is closest to the target frequency. For instance, the dielectric composition that provided the resonant frequency closest to the target frequency can be identified as the target composition. Once the target composition is identified, additional MRI receivers can be constructed such that the one or more tuning capacitors 22 in each of the receiver coils has a dielectric layer 30 with the target composition. Accordingly, the additional MRI receivers with each have one or more receiver coils with a resonant frequency that approximates or is equal to the target frequency. In some instances, the receiver coils and the additional receiver coils used to perform this process can be generated using the same set of screen-printing screens.

Although the above discussion is directed to a single receiver coil, an MRI receiver can include multiple receiver coils. The receiver coils on a common substrate 12 can each constructed as disclosed above and the resulting MRI receiver can retain the degree of flexibility discussed above. FIG. 4 illustrates an example of an MRI receiver having multiple receiver coils on a single substrate 12. Each receiver coil can be associated with a different pair of electrical contacts; however, the electrical contacts are not illustrated. The receiver coils overlap one another but are electrically insulated from one another. Since the receiver coil is formed on one side of the substrate 12 rather than both sides of the substrate 12, an MRI receiver can include receiver coils on opposing sides of the substrate 12. As a result, overlapping receiver coils can be electrically insulated from one another by placing overlapping receiver coils on opposing sides of the substrate 12. For instance receiver coils in FIG. 4 that are located on top of the substrate 12 are labeled T while the receiver coils in FIG. 4 located on the bottom of the substrate 12 are labeled B. In addition, or as an alternative to placing receiver coils on opposing sides of the substrate 12, electrical insulation can be achieved by placing an electrical insulator between overlapping regions of receiver coils. A suitable electrical insulator can be an insulating film applied by a printing technique such as screen-printing.

The ability to overlap receiver coils permits scaling of the MRI receiver to cover larger area substrates 12. Since the substrate 12 can also be thin, flexible and porous, common articles of clothing can serve as the substrate 12. For instance, FIG. 5 is a sideview of a t-shirt that includes an array of receiver coils. Each of the receiver coils is shown as being circular and the associated electrical contacts are not shown. Accordingly, the MRI receiver can be an article of clothing. Examples of other suitable articles of clothing that can serve as an MRI receiver include, but are not limited to, articles that surround a person when worn such as pants, hats, socks, shirts, belt, vests, overalls, overall coats, coats, etc. Alternately, the MRI receiver substrate 12 can be a blanket, sheet such as a bed sheet, or towel. The use of common articles such as clothing, blankets, or towels as the MRI receiver can move the receiver coil closer to the patient and be more comfortable for the patient.

Additionally, the MRI receiver can be embedded in another object. For instance, the MRI receiver can be bottom, top, or bottom layer of a blanket. For instance, FIG. 6 illustrates an MRI receiver having an array of receiver coils on a sheet of substrate 12. The MRI receiver is positioned between a top layer 50 and a bottom layer 52 of a blanket. The top layer is shown as peeled back so the underlying MRI receiver is visible. A blanket that includes an MRI receiver can easily be wrapped around the bodyparts being imaged. Further, the flexibility of the disclosed MRI receivers even makes it possible to wrap such a blanket around babies and infants. Alternately, the MRI receiver can be incorporated into a pillow or a bed.

As noted above, the substrate 12 can be a single layer of material or can include one or more layers that are attached to one another. When the substrate includes a single layer of material, the one or more receiver coils can be formed directly on the substrate. When the substrate includes multiple layers, the layers of the substrate can be attached to one another before the formation of one or more receiver coils on the substrate. Alternately, the one or more receiver coils can be formed on a first layer of the substrate before the first layer of the substrate is attached to one or more other layers so as to form the substrate. As an example, when the substrate is an article of clothing or a blanket, the one or more receiver coils can be formed directly on the substrate. Alternatively, when the substrate includes a layer of plastic the one or more receiver coils can be formed directly on the plastic and the result can later be attached to an article of clothing or a blanket.

EXAMPLES

Example 1

An MRI receiver was constructed according to FIG. 1 through FIG. 2E. An 8.7 cm diameter receiver coil was constructed on a 75 micron thick plastic substrate made from polyethylene terephthalate. The first conductor layer was screen printed onto the substrate in a pattern such as the pattern illustrated in FIG. 2A. The printing liquid used for the first conductor layer was CM 118-09 silver micro-flake ink available from Creative Materials, Inc. located in Ayer, Mass. After the printing liquid was placed on the substrate, the device precursor was annealed for 60 minutes at 120° C. to convert the silver ink to an electrically conducting solid that served as the first conductor layer. The first conductor layer had a thickness of 30 micron and a width of 0.5 cm.

The dielectric layer was screen printed onto the substrate and first conductor layer in a pattern such as the pattern illustrated in FIG. 2B. The printing liquid used for the dielectric layer was a blend of barium titanate ink ($BaTiO_3$) available from Conductive Compounds, Inc. located in Hudson, N.H. and the polymer precursors for CM 116-20 available from Creative Materials, Inc. located in Ayer, Mass. blended at ratios of 1:20. After the printing liquid was placed on the substrate, the device precursor was exposed to UV light to convert the printing liquid to a solid that served as the dielectric layer. The device was then subjected to a thermal anneal of 120° C. for 20 minutes to drive off any remaining solvent. The resulting dielectric layer had a thickness of 60 microns relative to the substrate and a thickness of 30 microns relative to the top of the first conductor layer.

The second conductor layer was screen printed onto the substrate in a pattern such as the pattern illustrated in FIG. 2C. The printing liquid used for the second conductor layer was CM 118-09 silver micro-flake ink available from Creative Materials, Inc. located in Ayer, Mass. After the printing liquid was placed on the substrate, the device precursor was annealed for 60 minutes at 120° C. to convert the silver ink to an electrically conducting solid that served as the second conductor layer. The second conductor layer had a thickness of 30 microns and a width of 0.5 cm. The result was an MRI receiver with a receiver coil constructed according to FIG. 2C through FIG. 2E. The receiver coil had a resonant frequency of about 127.7 MHz with input impedance matched to 50 ohms. As a result, the receiver coil was suitable for use with a 3T scanner.

Example 2

Figure 7:
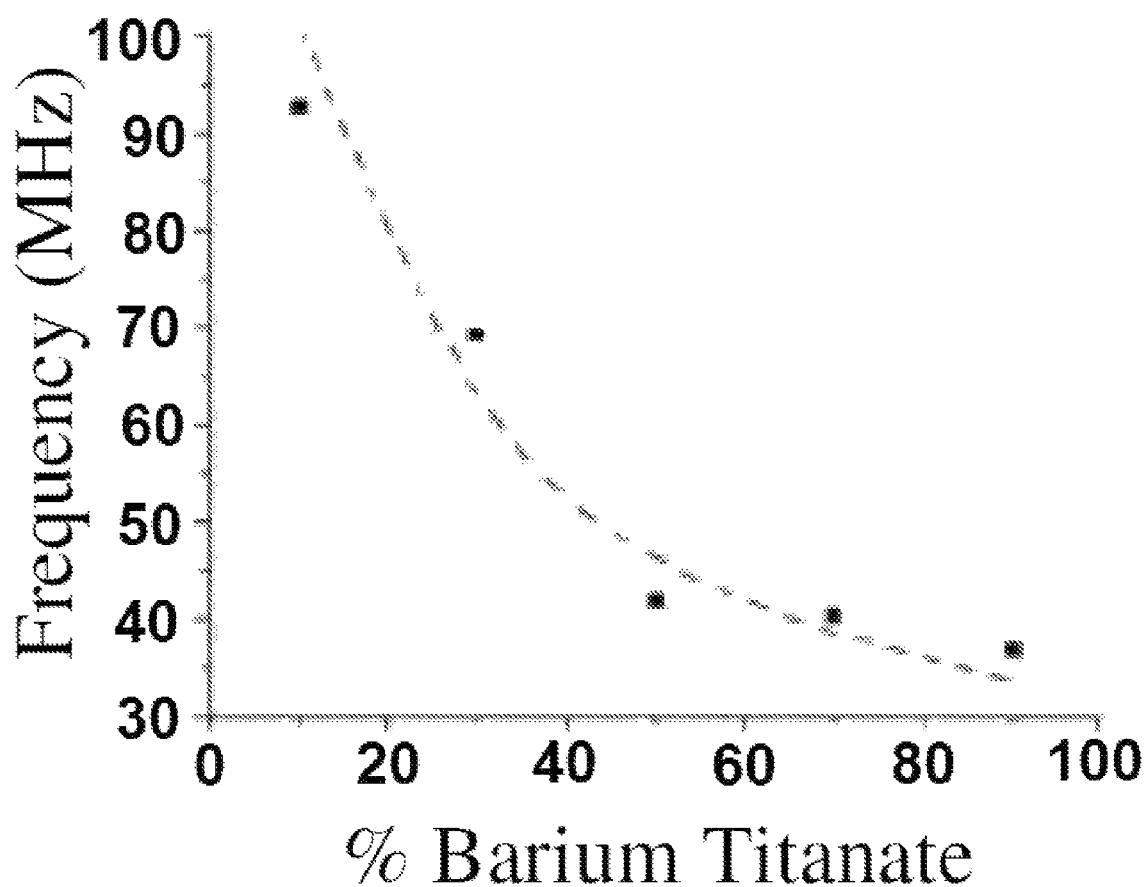
FIG. 7 is a graph of the resonant frequency for a receiver coil versus the proportion of a dielectric in the dielectric layer of a capacitor.

Several receiver coils were fabricated with the same dimensions. Each receiver coil contained a dielectric layer with a different ratio of barium titanate ink ($BaTiO_3$):CM 116-20UV curable ink. Resonant frequency was measured from an S21 trace on a network analyzer. These receiver coils were used to explore the relationship between the resonant frequency and the amount of dielectric in the tuning capacitors 22. FIG. 7 is a graph of the frequency versus the proportion of barium titanate in the dielectric layer. This graph illustrates that the resonant frequency for receiver coils constructed from a given set of screen-printing screens can be tuned simply by altering the proportion of dielectric in the dielectric layer.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A Magnetic Resonance Imaging (MRI) receiver, comprising:
    a receiver coil on a substrate, the receiver coil including a plurality of capacitors, the substrate having an upper surface and a lower surface, the upper surface of the substrate being between the plurality of capacitors and the lower surface of the substrate, the point under each of the plurality of capacitors being located on an upper surface of the substrate that is between the capacitors and the lower surface of the substrate;
    wherein the plurality of capacitors comprises:
        one or more first capacitor(s) that are matched to the input impedance of the receiver coil; and
        one or more second capacitor(s) configured to receive an RF signal from a tissue in a MRI scan; and
    wherein the MRI receiver is sufficiently flexible that the MRI receiver can be bent so as to have a radius of curvature less than 120 mm at a point under the capacitor without degrading a performance of the MRI receiver.

2. The receiver of claim 1, wherein the MRI receiver is sufficiently flexible that the MRI receiver can be bent so as to have a radius of curvature less than 10 mm at the point without degrading the performance of the MRI receiver.

3. The receiver of claim 1, wherein the MRI receiver is sufficiently flexible that the MRI receiver can be bent so as to have a radius of curvature less than 50 mm at any point under the capacitor without degrading a performance of the MRI receiver, where the point under the capacitor are each between the capacitor and the lower surface of the substrate.

4. The receiver of claim 1, wherein an upper surface of the capacitor is less than 100 µm above the upper surface of the substrate.

5. The receiver of claim 1, wherein a lower plate of the capacitor is a coating on the substrate and the lower plate is between an upper plate of the capacitor and the substrate.

6. The receiver of claim 5, wherein a surface of the coating is in direct contact with the substrate.

7. The receiver of claim 1, wherein the substrate includes a layer of plastic.

8. The receiver of claim 7, wherein the substrate includes a woven material.

9. The receiver of claim 7, wherein the substrate includes a fibrous material.

10. The receiver of claim 7, wherein the MRI receiver is article of clothing.

11. The receiver of claim 7, wherein the MRI receiver is a blanket or sheet.

12. The receiver of claim 1, wherein the substrate includes a porous material.

13. A Magnetic Resonance Imaging (MRI) receiver, comprising:
    a receiver coil on a substrate, the receiver coil includes a plurality of capacitors wherein the plurality of capacitors comprises:
    one or more first capacitor(s) that are matched to the input impedance of the receiver coil; and
    one or more second capacitor(s) configured to receive an RF signal from a tissue in a MRI scan; wherein the second capacitor comprises a lower plate and an upper plate, wherein the lower plate of the capacitor is between the upper plate of the capacitor and the substrate; and the lower plate of the capacitor is a layer of material that is in direct contact with the substrate.

14. The receiver of claim 13, wherein the lower plate of the capacitor includes an entire side in contact with the substrate.

15. A collection, comprising:
    Magnetic Resonance Imaging (MRI) receivers that each has a receiver coil on a substrate,
        each of the receiver coils including a capacitor, each of the different capacitors having a dielectric layer with a different percentage of a dielectric material in the dielectric layer;
        the different receiver coils each having a different resonant frequency when exposed to the same magnetic field but are constructed such that the different receiver coils would have the same resonant frequency if the dielectric layer in each of the different capacitors had the same percentage of the dielectric material.

16. The collection of claim 15, wherein the MRI receivers are each sufficiently flexible that each MRI receiver can be bent so as to have a radius of curvature less than 120 mm at a point on the portion of the substrate located under the capacitor without degrading a performance of the MRI receiver.

17. The collection of claim 15, wherein each of the capacitors include the dielectric layer between a lower plate and an upper plate and each of the capacitors has the lower plate between the upper plate and the substrate; and the lower plate of each of the capacitors is a layer of material that is in direct contact with the substrate.

18. A method comprising:

generating multiple Magnetic Resonance Imaging (MRI) receivers that each has a receiver coil on a different substrate, each of the receiver coils including a capacitor; and wherein generating the MRI receivers includes generating the different capacitors such that each of the different capacitors has a dielectric layer with a different percentage of a dielectric material in the dielectric layer and the different receiver coils each has a different resonant frequency when exposed to the same magnetic field but would have the same resonant frequency if the dielectric layer in each of the different capacitors had the same percentage of the dielectric material.

19. The method of claim 18, further comprising:

comparing the resonant frequencies of the different receiver coils to a target resonant frequency; and using the results of comparing the resonant frequencies to the target resonant frequency in order to identify a particular percentage of the dielectric material in the dielectric layer.

20. The method of claim 19, further comprising generating additional Magnetic Resonance Imaging (MRI) receivers that each includes the receiver coil on a different substrate, the receiver coils each including a capacitor that having a dielectric layer that includes the identified percentage of the dielectric material.

21. A method of forming a Magnetic Resonance Imaging (MRI) receiver, comprising:

forming a receiver coil on a substrate, the receiver coil including a plurality of capacitors on a substrate, wherein the plurality of capacitors comprises:

one or more first capacitor(s) that are matched to the input impedance of the receiver coil; and one or more second capacitor(s) configured to receive an RF signal from a tissue in a MRI scan, wherein one or more of the second capacitors comprises a first plate and a second plate and a dielectric layer between the first plate and the second plate; and forming the receiver coil including screen printing a layer of material on the substrate such that the layer of material serves as one of the components selected from the group consisting of the first plate, dielectric layer, and the second plate.

22. The method of claim 21, wherein forming the receiver coil includes screen printing a second layer of material on the substrate such that the second layer of material serves as one of the components selected from the group consisting of the first plate, dielectric layer, and the second plate, and the second layer serving a different one of the components than the first layer.

23. The method of claim 22, wherein forming the receiver coil includes screen printing a third layer of material on the substrate such that the third layer of material serves as one of the components selected from the group consisting of the first plate, dielectric layer, and the second plate, and the third layer serving a different one of the components than the first layer and the second layer.

24. The method of claim 21, wherein the layer of material physically contacts the substrate and serves as the first plate.

25. The method of claim 21, wherein the first plate is between the second plate and the substrate.

26. The method of claim 21, further comprising:

generating an article of clothing that includes the receiver coil.

27. The method of claim 21, wherein the MRI receiver is sufficiently flexible that the MRI receiver can be bent so as to have a radius of curvature less than 120 mm at a point under the capacitor without degrading a performance of the MRI receiver, the point being located on an upper surface of the substrate and between each of the plurality of capacitors and a lower surface of the substrate.

28. The method of claim 21, further comprising:

attaching the substrate to an article of clothing.

* * * * *